(12) United States Patent
Liu et al.

(10) Patent No.: US 8,633,065 B2
(45) Date of Patent: Jan. 21, 2014

(54) METHOD FOR MANUFACTURING MOTHER SUBSTRATE AND ARRAY SUBSTRATE

(71) Applicant: Beijing Boe Optoelectronics Technology Co., Ltd., Beijing (CN)

(72) Inventors: Huafeng Liu, Beijing (CN); Hongxi Xiao, Beijing (CN); Shunkang Su, Beijing (CN); Ping Wu, Beijing (CN); Hanting Ding, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/909,465

(22) Filed: Jun. 4, 2013

(65) Prior Publication Data
US 2013/0267053 A1    Oct. 10, 2013

Related U.S. Application Data

(62) Division of application No. 13/160,700, filed on Jun. 15, 2011, now Pat. No. 8,482,006.

(30) Foreign Application Priority Data

Jun. 21, 2010 (CN) .......................... 2010 1 0211521

(51) Int. Cl.
*H01L 21/00* (2006.01)
*H01L 21/84* (2006.01)

(52) U.S. Cl.
USPC 438/149; 438/151; 257/E21.32; 257/E21.561; 257/E21.7

(58) Field of Classification Search
USPC .......................... 438/149, 151, 152, 153, 161; 257/E21.32, E21.561, E21.7
See application file for complete search history.

(56) References Cited

U.S. PATENT DOCUMENTS

2005/0099583 A1 * 5/2005 Moriyama .................... 349/187

FOREIGN PATENT DOCUMENTS

| JP | 11-015017 A | 1/1999 |
| JP | 11-068110 A | 3/1999 |
| JP | 2000-098425 A | 4/2000 |
| JP | 2001-166701 A | 6/2001 |
| JP | 2005-283885 A | 10/2005 |

OTHER PUBLICATIONS

Third Japanese Office Action dated Nov. 26, 2013; Appln. No. 200980121649.6.

* cited by examiner

*Primary Examiner* — Hoai V Pham
(74) *Attorney, Agent, or Firm* — Ladas & Parry LLP

(57) ABSTRACT

The present invention relates to a method for manufacturing a mother substrate, the mother substrate comprising: a substrate comprising at least one display region and pre-cutting regions in a periphery of the display region, wherein the display region comprises gate scanning lines and data scanning lines, the pre-cutting regions comprise a gate-line connecting line and a data-line connecting line electrically connected to each other, and the gate-line connecting line is electrically connected to all of the gate scanning lines in the display region, and the data-line connecting line is electrically connected to all of the data scanning lines in the display region substrate.

6 Claims, 13 Drawing Sheets

METHOD FOR MANUFACTURING MOTHER SUBSTRATE AND ARRAY SUBSTRATE

BACKGROUND

Embodiments of the present invention relate to a mother substrate, an array substrate and a method for manufacturing the same.

In one current process for manufacturing a thin film transistor (TFT) array substrate of a liquid crystal display (LCD), a gate metal layer is firstly deposited on a base substrate and etched to form a gate pattern, and then, a gate insulating layer is deposited on the surface of the base substrate with the gate pattern and then an active layer and a source/drain metal layer are sequentially formed. The process for manufacturing the TFT array substrate comprises a depositing process, an etching process and the like. A deposition apparatus and an etching apparatus generally need a relative high operating voltage, and the relative high operating voltage may give rise to more charges that tend to be accumulated onto the metal layers of the TFT array substrate during the process for manufacturing the TFT array substrate. In additional, the TFT array substrate may be moved around many times during the manufacturing process, and in this case, friction between glass substrates of the TFT array substrates may occur, charges may generate on the glass substrates, and the generated charges may be transferred onto the gate metal layers directly contacting with the glass substrates.

In the current manufacturing process of the TFT array substrate, much more charges may be accumulated onto the metal layers during the manufacturing process, and the accumulation of charges is easy to generate a potential difference between the gate metal layer and the source/drain metal layer which are completely spaced from each other via the gate insulating layer of the TFT array substrate, and thus, electrostatic breakdown phenomenon potentially occurs which leads to reduced qualification ratio and yield of the products.

SUMMARY

An embodiment of the present invention provides a mother substrate, and the mother substrate comprising: a substrate, comprising at least one display region and pre-cutting regions in a periphery of the display region, wherein the display region comprises gate scanning lines and data scanning lines, the pre-cutting regions comprise a gate-line connecting line and a data-line connecting line electrically connected to each other, and the gate-line connecting line is electrically connected to all of the gate scanning lines in the display region, and the data-line connecting line is electrically connected to all of the data scanning lines in the display region substrate.

Another embodiment of the present invention provides a method for manufacturing a mother substrate, the mother substrate comprising at least one display region and pre-cutting regions in a periphery of the display region, the method comprising: forming gate scanning lines and data scanning lines in the display region and forming a gate-line connecting line and a data-line connecting line electrically connected to each other in the pre-cutting regions, wherein the gate-line connecting line is electrically connected to all of the gate scanning lines in the display region, and the data-line connecting line is electrically connected to all of the data scanning lines in the display region.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

Embodiments of the present invention provide a mother substrate, an array substrate and a method for manufacturing the same. The mother substrate comprises a substrate having at least one display region, wherein pre-cutting regions are disposed in a periphery of the at least one display region, such that the substrate is cut into at least one display panel in a cutting process. In order to suppress electrostatic breakdown phenomenon occurring in the process for manufacturing the array substrate, a gate-line connecting line and a data-line connecting line, which are electrically connected to each other, are respectively disposed in the pre-cutting regions at two adjacent sides of each display region of the mother substrate according to the embodiments of the present invention. The gate-line connecting line is electrically connected to all gate scanning lines in the corresponding display region and the data-line connecting line is electrically connected to all data line scanning lines in the corresponding display region.

In the embodiment of the present invention, if charges are accumulated onto a gate metal layer or a source/drain metal layer, the electrical connection descried above can make the accumulated charges be dispersed to all of the gate scanning lines and the data scanning lines so as to form an electrostatic balance. Under this state, the potentials of two conductors connected to each other are identical, so there is not the potential difference generated between the two metal layers. Therefore, with regard to the mother substrate, the array substrate and the method for manufacturing the same of the embodiments of the present invention, there is no potential difference generated between two metal layers, so electrostatic breakdown phenomenon can be effectively suppressed during the process for manufacturing the array substrate, and qualification ratio and yield of the products are improved.

First Embodiment

Figure 1:
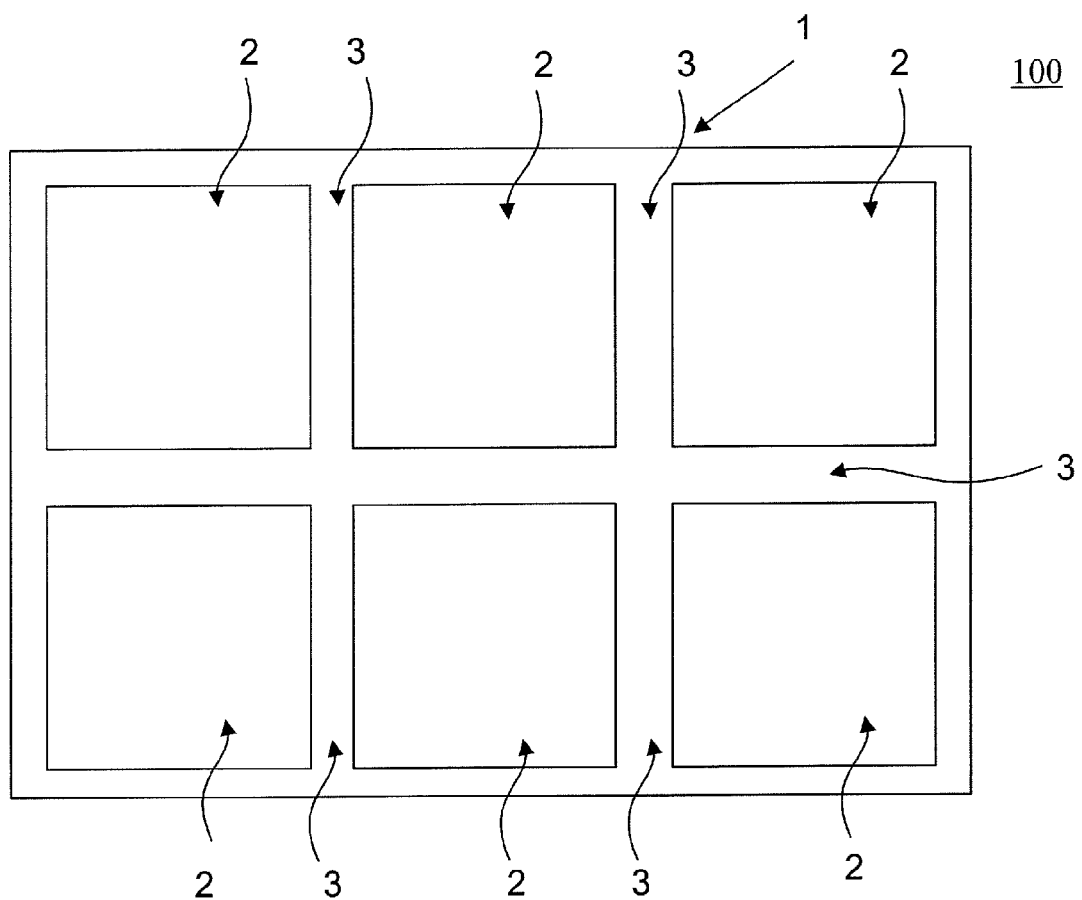
FIG. 1 is a schematic view of a mother substrate according to a first embodiment of the present invention.

An embodiment of the present invention provides a mother substrate 100. As shown in FIG. 1, the mother substrate 100 of the present embodiment comprises a base substrate 1 having at least one display region 2, and pre-cutting regions 3 are disposed in a periphery of the display region 2. After a process for forming a TFT array is completed on the substrate 1, a cutting process is performed at the pre-cutting regions 3 to cut each display region 2 into an independent array substrate. After cutting, each display region 2 is finally formed into one TFT array substrate for forming a liquid crystal panel of a liquid crystal display in cooperation with a color filter substrate. In order to suppress electrostatic breakdown phenomenon in the process for manufacturing the TFT array substrate, a gate-line connecting line and a data-line connecting line, which are electrically connected to each other, are respectively disposed in the pre-cutting regions 3 at two adjacent sides of each display region 2 of the mother substrate according to the present embodiment, and the gate-line connecting line is electrically connected to all gate scanning lines in the corresponding display region and the data-line connecting line is electrically connected to all data line scanning lines in the corresponding display region.

Figure 2:
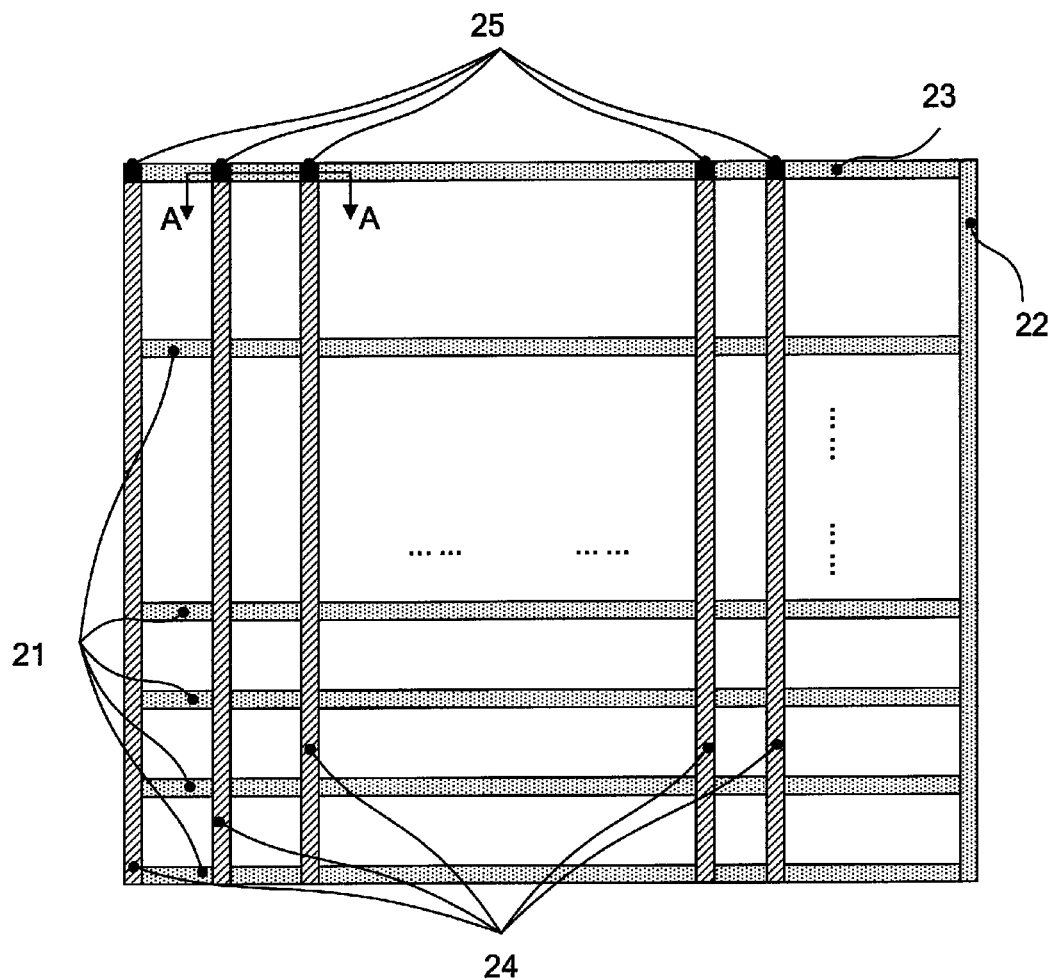
FIG. 2 is a schematic view of one display region of the mother substrate according to the first embodiment of the present invention.

Next, the explanation in detail is given by taking one display region as an example. FIG. 2 is a schematic view of one display region and only shows the structure of a gate metal layer and a source/drain metal layer.

Figure 3:
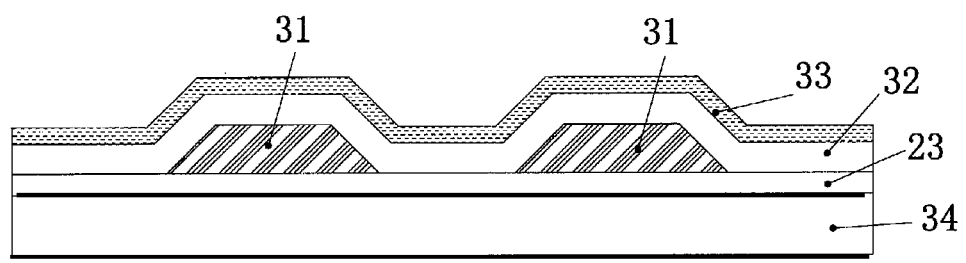
FIG. 3 is a cross-sectional view taken along A-A line after the deposition of an active thin film according to the first embodiment of the present invention.

As shown in FIG. 2 and FIG. 3, a gate-line connecting line 22 and a data-line connecting line 23 are formed in the same layer as gate scanning lines 21 in the present embodiment, and the gate-line connecting line 22 and the data-line connecting line 23 can be manufactured by the same mask process (patterning process)as the gate scanning lines 21. Compared with a conventional process for manufacturing the gate scanning lines, the mask patterns are changed only. The gate scanning lines 21 extend substantially parallel to each other in the display region, and the gate-line connecting line 22 and the data-line connecting line 23 are located in a periphery of the display region. Because the gate-line connecting line 22, the data-line connecting line 23 and the gate scanning lines 21 are located in the same layer, the gate-line connecting line 22 and the data-line connecting line 23 can be in direct electric connection with each other and the gate-line connecting line 22 can be in direct electric connection with the gate scanning lines 21 in the corresponding display region. In this end, by only connecting the regions corresponding to the gate-line connecting line 22, the data-line connecting line 23 and the gate scanning lines 21 on the mask plate for forming the pattern, the direct electrical connection can be achieved.

Data scanning lines 24 located in an upper layer can be electrically connected to the data-line connecting line 23 via through holes. Because the data-line connecting line 23 is located in the gate metal layer, in order to connect the data scanning lines 24 later formed to the data-line connecting line 23, photoresist parts 31 may be pre-retained on the data-line connecting line 23 at intersections 25 of the data-line connecting line 23 and the data scanning lines 24 in the process for forming the gate metal layer on the a glass substrate 34 according to the present embodiment, as shown in FIG. 3. Then, a gate insulating thin film 32 is directly deposited on the base substrate 1 with the pre-retrained photoresist parts 31, and the pre-retrained photoresist parts 31 is lifted off during the process for manufacturing an active thin film pattern, such that the pre-retrained photoresist parts 31, the corresponding gate insulating thin film 32 and the active thin film 33 on the photoresist parts 31 are etched away.

Figure 4:
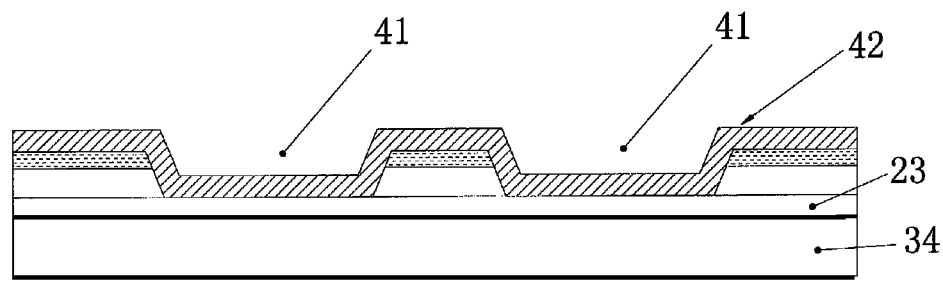
FIG. 4 is a cross-sectional view taken along A-A line after the deposition of a source/drain metal layer according to the first embodiment of the present invention.

As shown in FIG. 4, through holes 41 can be formed in the gate insulating thin film at the pre-retrained photoresist parts 31 by the lifting-off process mentioned above, and then, a source/drain metal layer 42 is deposited on the base substrate on which the through holes 41 are formed, and a source/drain pattern (not shown) of the thin film transistor and the data scanning lines 24 are formed by etching the source/drain metal layer 42. In order to electrically connect the data-line connecting line 23 to the data scanning lines 24, the data scanning lines 24 are extended to a position of the pre-retrained photoresist parts 31, and because the through holes 41 are formed at the pre-retrained photoresist parts 31, the data scanning lines 24 can be electrical connected to the data-line connecting line 23 by the through holes 41.

With the lifting-off process to form the through holes, the process of the embodiment can be a modification directly based on a current technology, and the number of the mask processes is not increased, and that is, the number of the MASK processes may be relatively decreased in the process for manufacturing the TFT array substrate, production efficiency can be improved, and the process can be compatible with the current manufacturing processes.

An embodiment of the present invention may utilize but not be limited to the following solution for electrically connecting the data scanning lines to the data-line connecting line: the through holes are formed with an etching process in the gate insulating thin film at positions corresponding to the intersections of the data-line connecting line and the data scanning lines, and thus, the data-line connecting line can be electrically connected to all of the data scanning lines of the corresponding display region by the through holes.

No matter how to form the through holes, the data-line connecting line can be made electrically connected to the data scanning lines. At this time, because the gate-line connecting line is in direct electric connection with both the data-line connecting line and the gate scanning lines, if charges are accumulated onto the gate metal layer or the source/drain metal layer, the accumulated charges can be dispersed to all of the gate scanning lines and the data scanning lines by means of the above electrical connection relationship so as to form the electrostatic balance. Under the state of the electrostatic balance, the potentials of two conductors connected to each other are identical, so there is no potential difference generated between two metal layers. Therefore, with regard to the mother substrate, the array substrate and the method for manufacturing the same provided by the embodiment of the present invention, because there is no potential difference generated between two metal layers, electrostatic breakdown phenomenon can be effectively suppressed during the process for manufacturing the TFT array substrate, and qualification ratio and yield of the products are improved.

In the mother substrate provided by an embodiment of the present invention, at least one PAD region (including a gate scanning line PAD region and a data scanning line PAD region) is provided for each display region, such that the display region is connected to an exterior driving circuit by the PAD region. In order to not disadvantageously affect the forming of the current PAD region, the gate-line connecting line is formed in a pre-cutting region at the side opposite to the gate scanning line PAD region and the data-line connecting line is formed in a pre-cutting region at the side opposite to the data scanning line PAD region in a the present embodiment.

Because before cutting, the mother substrate needs to be tested to detect the characteristics of electrical connection of the mother substrate, in order to avoid disadvantageously affecting the testing, before the mother substrate is tested, disconnection regions are formed at the ends, electrically connected to the gate-line connecting line, of the gate scanning lines by an etching process to disconnect the electrical connection of the gate-line connecting line and the gate scanning lines; disconnection regions are formed at the ends, electrically connected to the data-line connecting line, of the data scanning lines by an etching process to disconnect the electrical connection of the data-line connecting line and the data scanning lines. The disconnection regions are formed by etching so that the data scanning lines and the gate scanning lines are independent from each other, and thus, the signal interference is generated, which facilitates the testing on the mother substrate in a subsequent process.

The above disconnection regions of the data scanning lines may be selected from, but not be limited to, the following two positions: the disconnection region of one data scanning line locates at the position where the data scanning line is electrically connected to the data-line connecting line; and the disconnection region of one data scanning line locates at the position which is shifted a predetermined distance from the position, where the data scanning line and the data-line connecting line are electrically connected, towards the data scanning line.

The above disconnection regions of the gate scanning lines may be selected from, but not be limited to, the following two positions: the disconnection region of the gate scanning line locates at the position where one gate scanning line is electrically connected to the gate-line connecting line; and the disconnection region of one gate scanning line locates at a position which is shifted a predetermined distance from the position, where the gate scanning line and the gate-line connecting line are electrically connected, towards the gate scanning line.

The embodiment of the present invention also provides a method for manufacturing the TFT array substrate, as shown in FIG. 5a through FIG. 5g, and the method comprises the following steps.

Figure 5A:
FIG. 5a-5g show a first through seventh steps of a method for manufacturing the TFT array substrate according to the first embodiment of the present invention.

(1) A mother substrate for forming the TFT substrate according to the present embodiment comprises at least one display region, and a gate metal layer 35 is formed on a glass substrate 34, as shown in FIG. 5a.

Figure 5B:
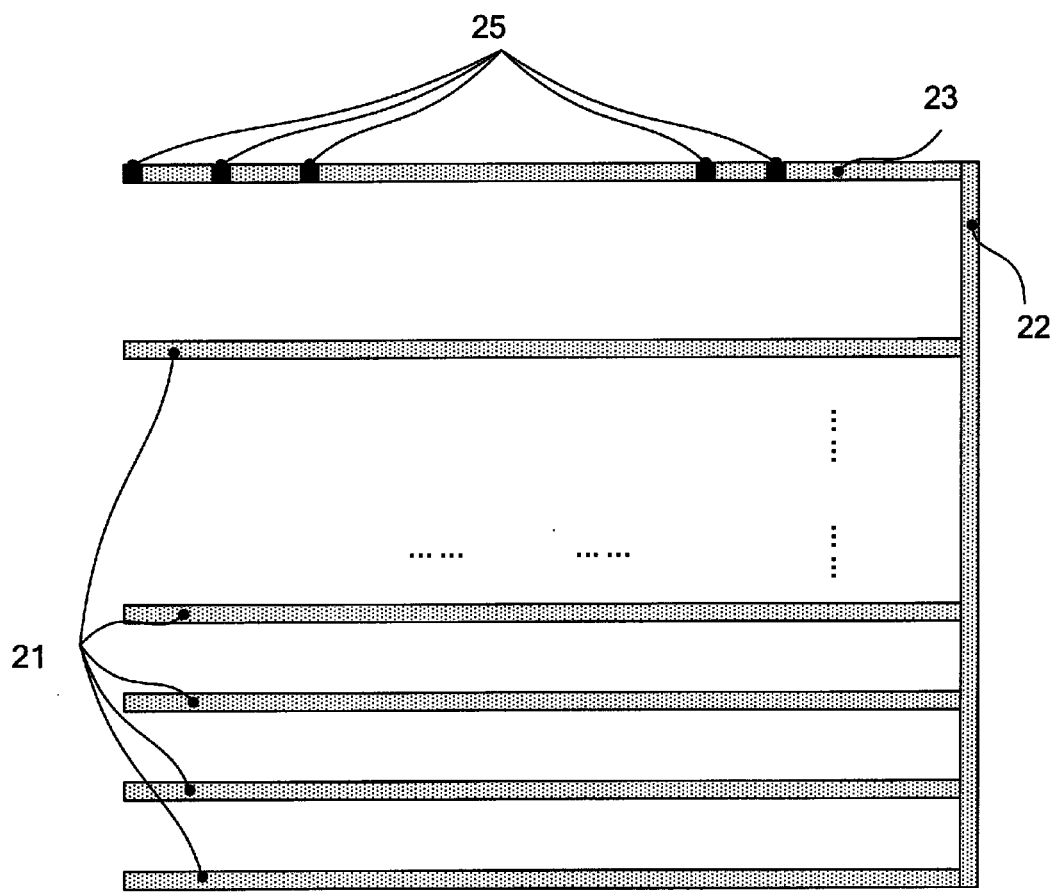

(2) The gate metal layer 35 is patterned, such that the gate metal layer 35 is formed into a gate pattern, as shown in FIG. 5b, wherein the gate pattern comprises gate scanning lines 21, gate electrodes connected to the gate scanning lines (not shown)and a gate-line connecting line 22 and a data-line connecting line 23 respectively located at adjacent two sides of each display region, and the gate-line connecting line 22 is directly connected to both the data-line connecting line 23 and the gate scanning lines 2.

Figure 5C:
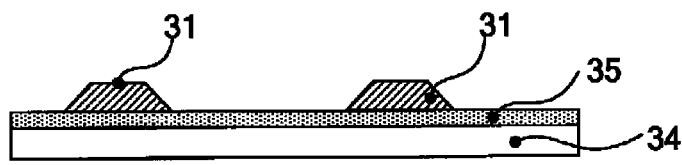

In order to facilitate the electrical connection of the data-line connecting line 23 and data scanning lines manufactured in the sequent process, photoresist parts may be pre-retained on the data-line connecting line at intersections 25 of the data-line connecting line and the data scanning lines to be formed, and the details of the pre-retained photoresist parts 31 can refer to FIG. 5c.

The patterning process mentioned in this description typically comprises applying photoresist, exposing and developing of the photoresist, etching with a formed photoresist pattern, removing remaining photoresist, and etc, wherein the removing of the photoresist may further comprise the lifting-off process or ashing process. The positive type photoresist is taken as an example.

In operation, a method for retaining the photoresist parts may include, but not limited to, the following manner: the photoresist coated on the gate metal layer is formed into a completely-remained region, a partially-remained region and a completely-removed region by using a half-tone mask or a gray-tone mask, wherein the completely-remained region corresponds to the positions of the pre-retained photoresist parts, the completely-removed region corresponds to a position where the gate metal layer need to be etched away, and the partially-remained region corresponds to other position of the gate pattern. After exposing and developing, the gate metal exposed in the completely-removed region is etched away, and then, the photoresist in the partially-remained region is ashed and removed. The photoresist in the completely-remained region is thinned when the photoresist in the partially-remained region is removed, but a portion of the photoresist in the completely-remained region is still retained. In order to facilitate the following lifting-off process, the area of the pre-retained photoresist can be enlarged to some extent, or sides of the top portion of the pre-retained photoresist part is treated into a shape that is easily lifted-off, such as inverse trapezoid.

Figure 5D:
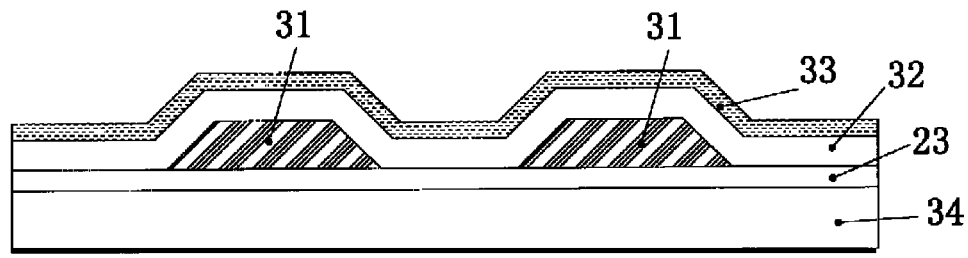

(3) As shown in FIG. 5d, a gate insulating thin film 32 and an active thin film 33 are sequentially deposited on the substrate 34 with the gate pattern.

Figure 5E:
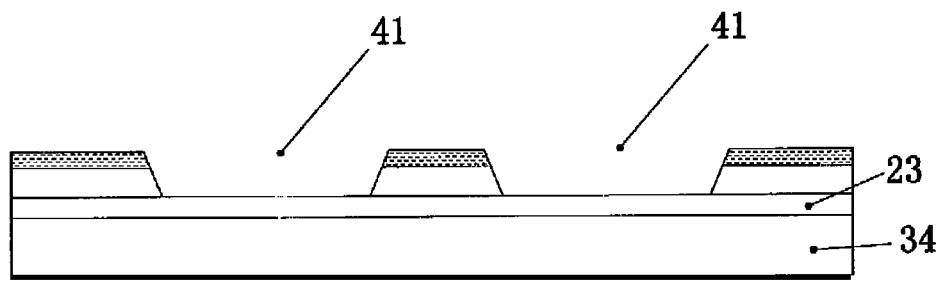

(4) The active thin film is patterned so that the active thin film 33 is formed into an active thin film pattern overlapping with the gate electrode, and lifting-off the pre-retained photoresist to remove the pre-retained photoresist, the gate insulating thin film 32 and the active thin film 33 corresponding to the pre-retained photoresist so as to form through holes 41 and expose the data-line connecting line 23 at the pre-retained photoresist parts 31, and FIG. 5e shows a cross-sectional view of the substrate taken at the pre-retained photoresist parts 31 after the lifting-off process.

Figure 5F:
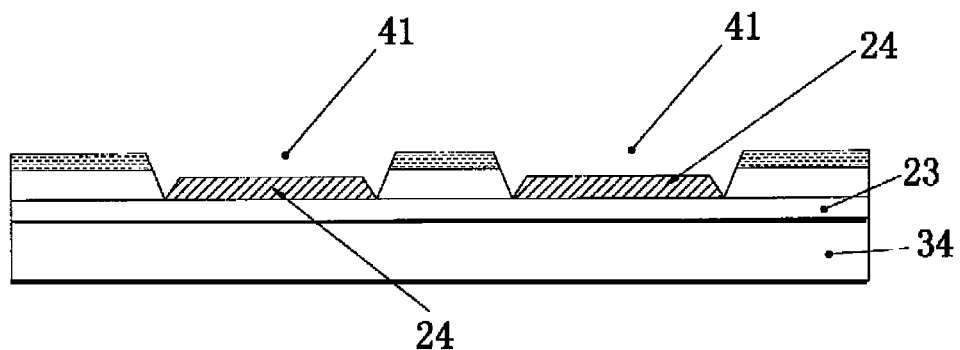

(5) A source/drain metal layer is deposited on the substrate 34 with the active thin film pattern and patterning the source/drain metal layer so that the source/drain metal layer is formed into a source/drain pattern. As shown in FIG. 2 and FIG. 5f, the source/drain pattern comprises data scanning lines 24 intersected with the gate scanning lines 21 and source/drain electrodes of a thin film transistor, wherein the data scanning lines 24 extend to positions 25 of the pre-retained photoresist parts, and because the data-line connecting line 23 is exposed at the positions 25 of the pre-retained photoresist parts, the data scanning lines 24 can be electrically connected to the data-line connecting line 23.

With regard to the TFT array substrate manufactured by using the above method, during the manufacturing process, the data-line connecting line and the data scanning lines can be electrically connected to each other by the through holes, and the gate-line connecting line is in direct electric connection with both the data-line connecting line and the gate scanning lines. Because there is no potential difference generated between two metal layers, electrostatic breakdown phenomenon is effectively suppressed during the process for manufacturing the TFT array substrate, and qualification ratio and yield of the products are improved.

Because before cutting, the mother substrate needs to be tested to detect the characteristics of electrical connection of the mother substrate, in order to avoid disadvantageously affecting the testing, the present embodiment further comprises the following steps before the mother substrate is tested.

(6) A patterning process is performed after depositing a passivation layer to form through holes at the ends, electrically connected to the gate-line connecting line, of the gate scanning lines by using an etching process so as to expose the gate scanning lines and to form through holes at the ends, electrically connected to the data-line connecting line, of the data scanning lines by using an etching process so as to expose the data scanning lines.

(7) Portions of the data scanning lines and the gate scanning lines exposed through the through holes are removed by using an etching process to form disconnection regions 28 and 29 of the data scanning lines and the gate scanning lines. The disconnection regions 28 and 29 are shown in FIG. 5g.

Figure 5G:
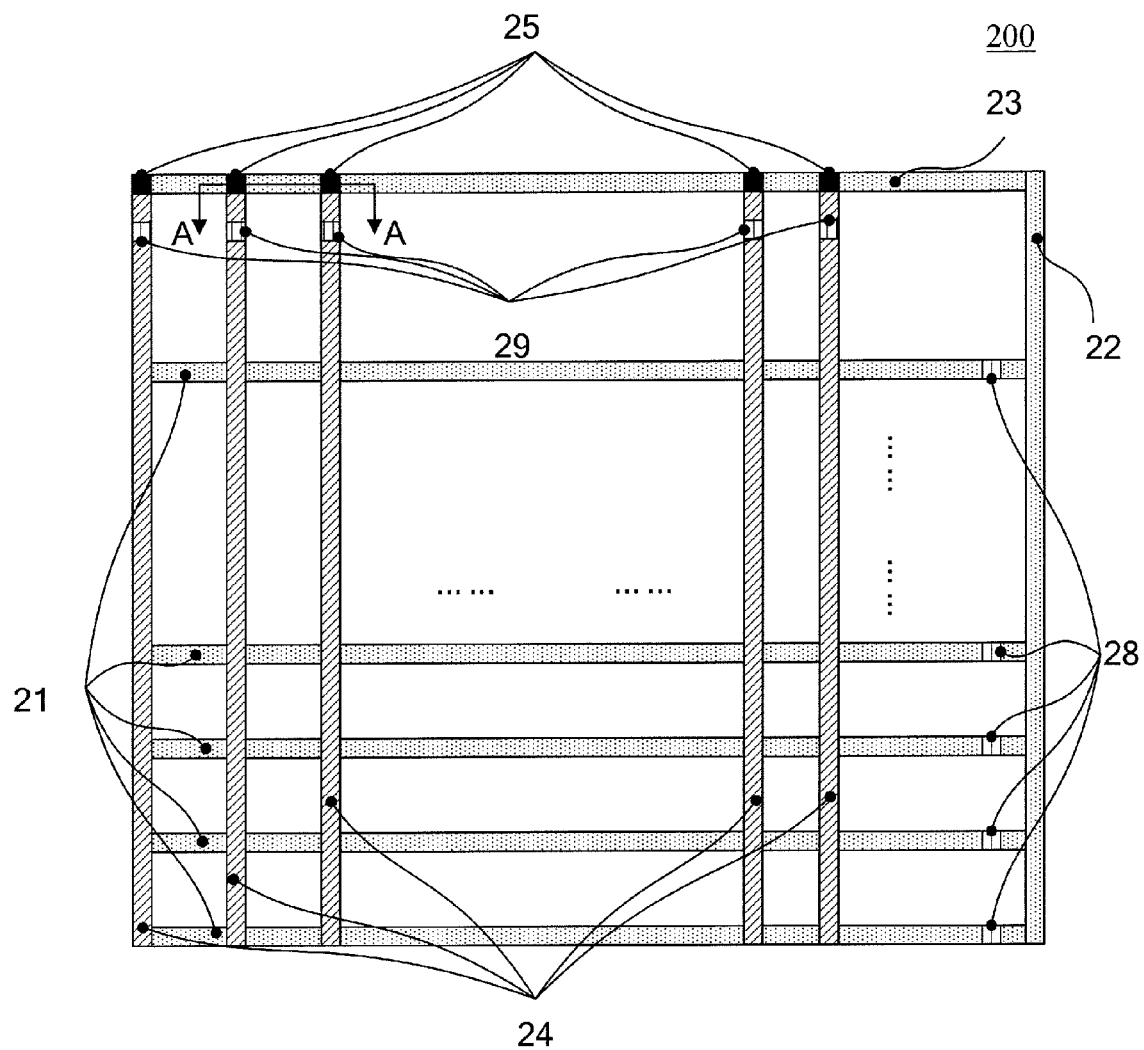

The disconnection regions of the gate scanning lines may be selected from, but not be limited to, the following two positions: the disconnection region of one gate scanning line locates at the position where the gate scanning line is electrically connected to the gate-line connecting line; as shown in FIG. 5g, the disconnection region 28 of one gate scanning line locates at the position which is shifted a predetermined distance from the position, where the gate scanning line and the gate-line connecting line are electrically connected, towards the gate scanning line.

The disconnection regions of the data scanning lines may be selected from, but not be limited to, the following two positions: the disconnection region of one data scanning line is overlapped with the position of the pre-retained photoresist part, and the area of the disconnection region is generally larger than the area of the pre-retained photoresist part; as shown in FIG. 5g, the disconnection region 29 of one data scanning line locates at the position which is shifted a predetermined distance from the position of the pre-retained photoresist part towards the data scanning line.

Second Embodiment

An embodiment of the present invention provides a mother substrate 200, the main structure of the mother substrate 200 is the same as that of the mother substrate 100 of the first embodiment, and the mother substrate 200 comprises a based substrate having at least one display region thereon, and pre-cutting regions are disposed around each display region or between two adjacent display regions. After a process for forming a TFT array is completed, a cutting process is performed at the pre-cutting regions to cut each display region into an independent array substrate, and each display region is finally formed into one TFT array substrate for forming a liquid crystal panel of a liquid crystal display.

Figure 6:
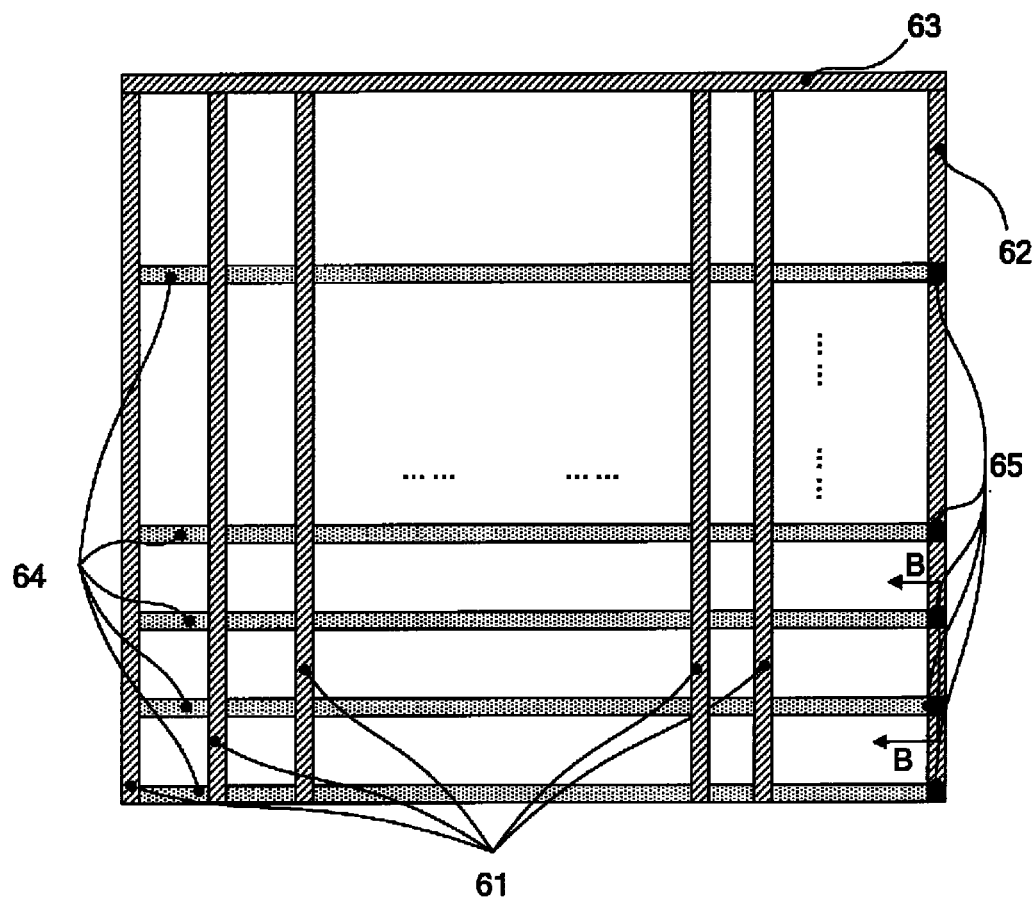
FIG. 6 is a schematic view of one display region of a mother substrate according to a second embodiment of the present invention.

In order to suppress electrostatic breakdown phenomenon occurring in the process for manufacturing the TFT array substrate, similar to that of the first embodiment, the second embodiment has two metal layers electrically connected so as to make the potentials of the metal layers equal to each other. Next, the explanation in detail is given with regard to the electrical connection by taking one display region as an example. FIG. 6 only shows the structure of a gate metal layer and a source/drain metal layer.

Figure 7:
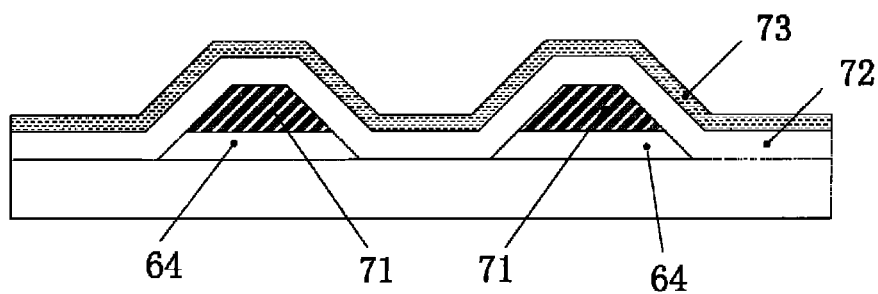
FIG. 7 is a cross-sectional view taken along B-B line after the deposition of an active thin film according to the second embodiment of the present invention.

As shown in FIG. 6 and FIG. 7, a gate-line connecting line 62 and a data-line connecting line 63 are formed in the same layer as data scanning lines 61 in the present embodiment, and the gate-line connecting line 62 and the data-line connecting line 63 can be manufactured in the same mask process (patterning process) as the data scanning lines 61. Compared with the conventional process for manufacturing the data scanning lines, the mask patterns are changed only. Gate scanning lines 64 extend substantially parallel to each other in the display region, the data scanning lines 61 also extend substantially parallel to each other and are intersected with the gate scanning lines 64, and the gate-line connecting line 62 and the data-line connecting line 63 are located in a periphery of each display region. Because the gate-line connecting line 62, the data-line connecting line 63 and the data scanning lines 61 are located in the same layer, the gate-line connecting line and the data-line connecting line can be in direct electric connection with each other and the data-line connecting line can be in direct electric connection with the data scanning lines in the corresponding display region. In this end, by only connecting the regions corresponding to the gate-line connecting line, the data-line connecting line and the data scanning lines on the mask plate for forming pattern, the direct electrical connection may be achieved.

Gate-line connecting line 62 located in an upper layer can be electrically connected to the gate scanning lines 64 via through holes. Because the gate-line connecting line 62 is located in the source/drain metal layer, in order to connect the gate scanning lines 64 to the gate-line connecting line 62, photoresist parts 71 can be pre-retained on the gate scanning lines 64 at intersections 25 of the gate-line connecting line 62 and the gate scanning lines 64 in the process for forming the gate metal layer according to the present embodiment, and then, a gate insulating thin film 72 and an active thin film 73 are deposited on the substrate with the pre-retained photoresist parts 71.

Figure 8:
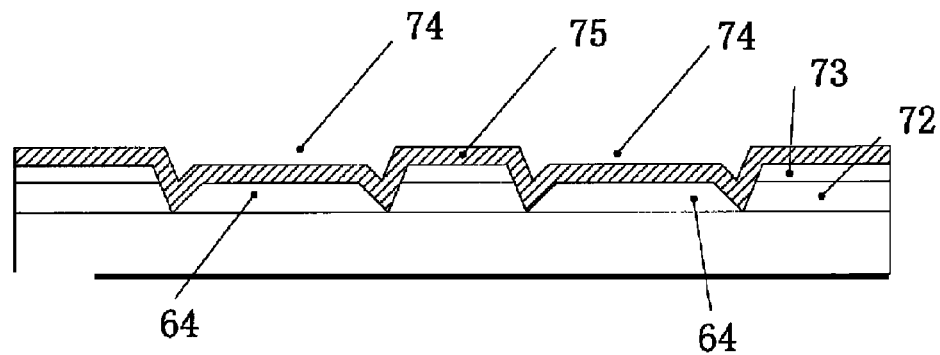
FIG. 8 is a cross-sectional view taken along B-B line after the deposition of a source/drain metal layer according to the second embodiment of the present invention.

As shown in FIG. 8, the pre-retrained photoresist parts 71 are lifted off during the process for manufacturing an active thin film pattern, such that the pre-retrained photoresist parts 71, the corresponding gate insulating thin film 72 and the active thin film 73 on the photoresist parts 71 are removed by etching. Through holes 74 can be formed in the gate insulating thin film and at the pre-retrained photoresist parts 71 by a lifting-off process mentioned above, and then, a source/drain metal layer 75 is deposited on the base substrate on which the through holes 74 are formed, and a source/drain pattern is formed by etching the source/drain metal layer 75. The source/drain pattern comprises the data scanning lines 61 intersected with the gate scanning lines 64 and source/drain electrodes of thin film transistors. In order to electrically connect the gate-line connecting line 62 to the gate scanning lines 64, the gate-line connecting line 62 is directly formed at positions corresponding to the through holes 74 so that the gate-line connecting line 62 is electrically connected to the gate scanning lines 64 via the through holes 74.

An embodiment of the present invention can utilize but not be limited to the following way for electrically connecting the gate scanning lines to the gate-line connecting line: the through holes are formed in the gate insulating thin film at positions corresponding to the intersections of the gate-line connecting line and the gate scanning lines, and thus, the gate-line connecting line can be electrically connected to all of the gate scanning lines of the corresponding display region by the through holes.

No matter how to form the through holes, the gate-line connecting line can be made electrically connected to the gate scanning lines. At this time, because the data-line connecting line is in direct electric connection with both the gate-line connecting line and the data scanning lines, if charges are accumulated onto the gate metal layer or the source/drain metal layer, the accumulated charges can be dispersed to all of the gate scanning lines and the data scanning lines by the above electrical connection relationship so as to form the electrostatic balance. Under the state of the electrostatic balance, the potentials of two conductors connected to each other are identical, so there is no potential difference generated between two metal layers. Therefore, with regard to the mother substrate, the array substrate and the method for manufacturing the same provided by the embodiment of the present invention, because there is no potential difference generated between two metal layers, so electrostatic breakdown phenomenon is effectively suppressed during the process for manufacturing the TFT array substrate, and qualification ratio and yield of the products are improved.

In the mother substrate provided by an embodiment of the present invention, at least one PAD region (including a gate scanning line PAD region and a data scanning line PAD region) is provided for each display region, such that the display region is connected to an exterior driving circuit by the PAD region. In order to not disadvantageously affect the forming of the current PAD region, the gate-line connecting line is formed in a pre-cutting region at the side opposite to the gate scanning line PAD region, and the data-line connecting line is formed in a pre-cutting region at the side opposite to the data scanning line PAD region in the present embodiment.

Because before cutting, the mother substrate needs to be tested to detect the characteristics of electrical connection of the mother substrate, in order not to influence the testing, before the mother substrate is tested, disconnection regions are formed at the ends, electrically connected to the gate-line connecting line, of the gate scanning lines by an etching process to disconnect the electrical connection of the gate-line connecting line and the gate scanning lines; disconnection regions are formed at the ends, electrically connected to the data-line connecting line, of the data scanning lines by an etching process to disconnect the electrical connection of the data-line connecting line and the data scanning lines. The disconnection regions are formed by etching so that the data scanning lines and the gate scanning lines are independent from each other, and thus, the signal interference is not generated, which facilitates the testing on the mother substrate in a subsequent process.

The above disconnection regions of the data scanning lines and the gate scanning lines may be selected from, but not be limited to, the two positions mentioned above.

The embodiment of the present invention also provides a method for manufacturing the TFT array substrate, as shown in FIG. 9a through FIG. 9g, and the method comprises the following steps.

Figure 9A:
FIG. 9a-9g show a first through seventh steps of a method for manufacturing the TFT array substrate according to the second embodiment of the present invention.

(1) A mother substrate for forming the TFT substrate according to the present embodiment comprises at least one display region, and a gate metal layer 68 is formed on a glass substrate 67, as shown in FIG. 9a.

Figure 9B:
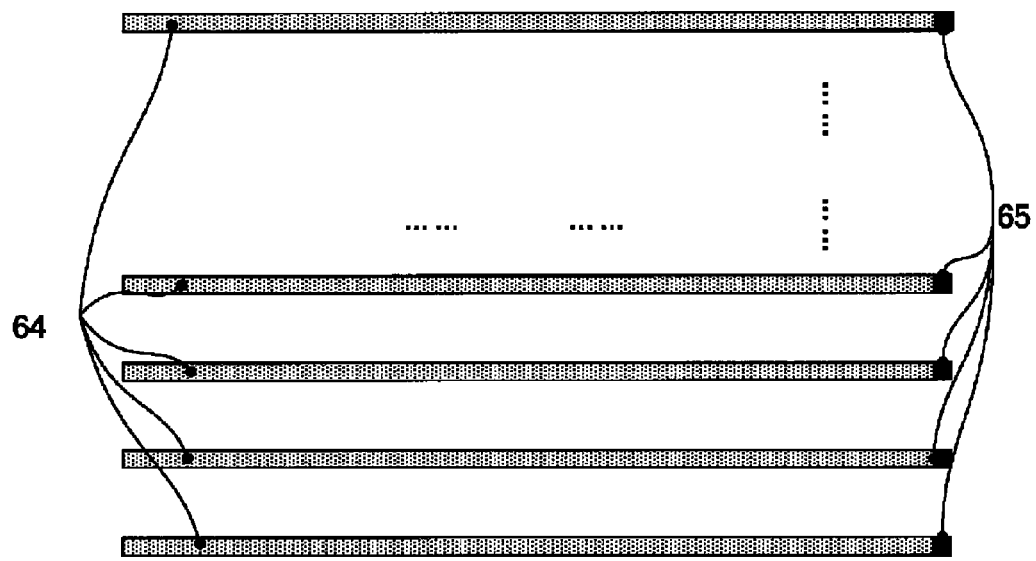
Figure 9C:
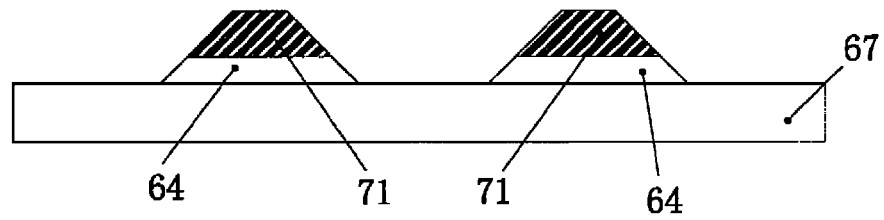

(2) The gate metal layer 68 is patterned, such that the gate metal layer 68 is formed into a gate pattern, as shown in FIG. 9b, wherein the gate pattern comprises gate scanning lines 64 and gate electrodes connected to the gate scanning lines. In order to facilitate the electrical connection of the gate scanning lines 64 and gate-line connecting line manufactured in the sequent process, photoresist parts 71 are pre-retained on the gate scanning lines 64 at intersections 65 of the gate scanning lines and the gate-line connecting line to be formed, and the details of the pre-retained photoresist parts 71 can refer to FIG. 9c.

In operation, a method for retaining the photoresist parts may include, but not be limited to, the following manner: the photoresist coated on the gate metal layer is formed into a completely-remained region, a partially-remained region and a completely-removed region by using a half-tone mask or a gray-tone mask, wherein the completely-remained region corresponds to the positions of the pre-retained photoresist parts, the completely-removed region corresponds to a position where the gate metal layer need to be etched away and the partially-remained region corresponds to other position of the gate pattern. After exposing and developing, the gate metal exposed in the completely-removed region is etched away, and then, the photoresist in the partially-remained region is ashed and removed. The photoresist in the completely-remained region is thinned when the photoresist in the partially-remained region is removed, but a portion of the photoresist in the completely-remained region is still retained. In order to facilitate the following lifting-off process, the area of the pre-retained photoresist may be enlarged, or sides of the top portion of the pre-retained photoresist is treated into a shape that is easily lifted-off, such as inverse trapezoid.

Figure 9D:
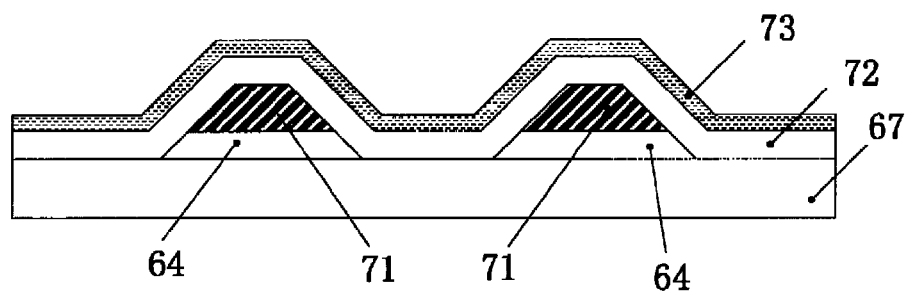

(3) As shown in FIG. 9d, a gate insulating thin film 72 and an active thin film 73 are sequentially deposited on the substrate 67 with the gate pattern.

Figure 9E:
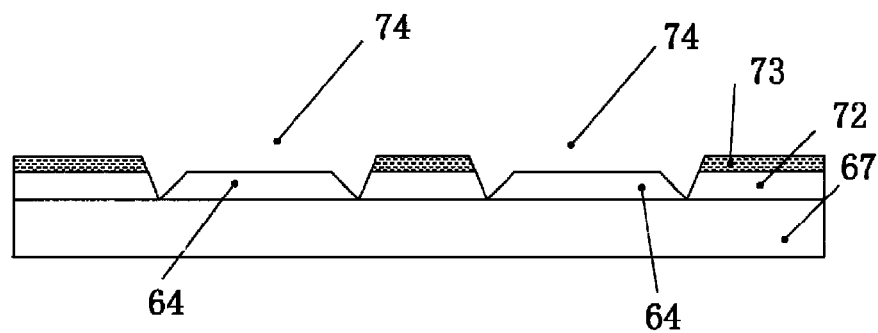

(4) The active thin film is patterned so that the active thin film 73 is formed into an active thin film pattern overlapping with the gate electrode, and lifting-off the pre-retained photoresist parts 71 to remove the pre-retained photoresist parts, the gate insulating thin film 72 and the active thin film 73 corresponding to the pre-retained photoresist parts so as to form through holes 74 and expose the gate scanning lines 64 at the pre-retained photoresist parts, and FIG. 9e shows a cross-sectional view of the substrate taken at the pre-retained photoresist parts after the lifting-off process.

Figure 9F:
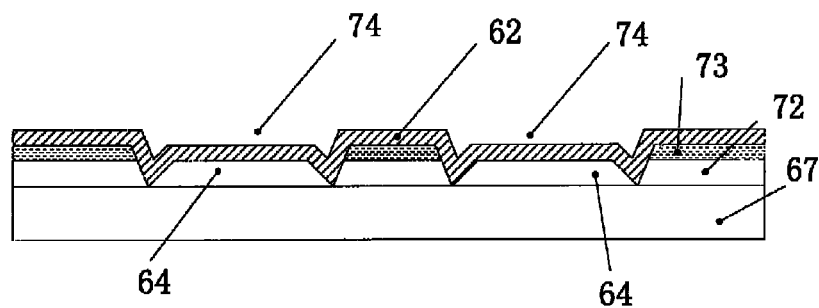

(5) A source/drain metal layer is deposited on the substrate with the active thin film pattern and patterning the source/drain metal layer so that the source/drain metal layer is formed into a source/drain pattern (not shown), data scanning lines 61 and a gate-line connecting line 62 and a data-line connecting line 63 respectively located at adjacent two sides of each display region, as shown in FIG. 6 and FIG. 9f. The data-line connecting line 63 is in direct electric connection with both the gate-line connecting line 62 and the data scanning lines 61, and because the gate scanning lines 64 are exposed at the positions 65 of the pre-retained photoresist parts, by only forming the gate-line connecting line 63 at the positions 65 of the pre-retained photoresist parts, the gate-line connecting line 63 can be electrically connected to the gate scanning lines 64 via through holes 74.

With regard to the TFT array substrate manufactured by using the above method, during the manufacturing process, the gate-line connecting line and the gate scanning lines are electrically connected to each other by the through holes, and the data-line connecting line is in direct electric connection with both the gate-line connecting line and the data scanning lines. Therefore, with regard to the mother substrate, the TFT array substrate and the method for manufacturing the same, because there is no potential difference generated between two metal layers, electrostatic breakdown phenomenon is effectively suppressed during the process for manufacturing the TFT array substrate, and qualification ratio and yield of the products are improved.

Because before cutting, the mother substrate needs to be tested to detect the characteristics of electrical connection of the mother substrate, in order to avoid disadvantageously affecting the testing, the present embodiment further comprises the following steps before the mother substrate is tested.

(6) A patterning process is performed after deposing a passivation layer to form through holes at ends, electrically connected to the gate-line connecting line, of the gate scanning lines by using an etching process so as to expose the gate scanning lines, and to form through holes at ends, electrically connected to the data-line connecting line, of the data scanning lines by using an etching process so as to expose the data scanning lines.

(7) Portions of the data scanning lines and the gate scanning lines exposed through the through holes are removed by using an etching process to form disconnection regions 76 and 77 of the data scanning lines and the gate scanning lines, respectively. The disconnection regions 76 and 77 are shown in FIG. 9g.

Figure 9G:
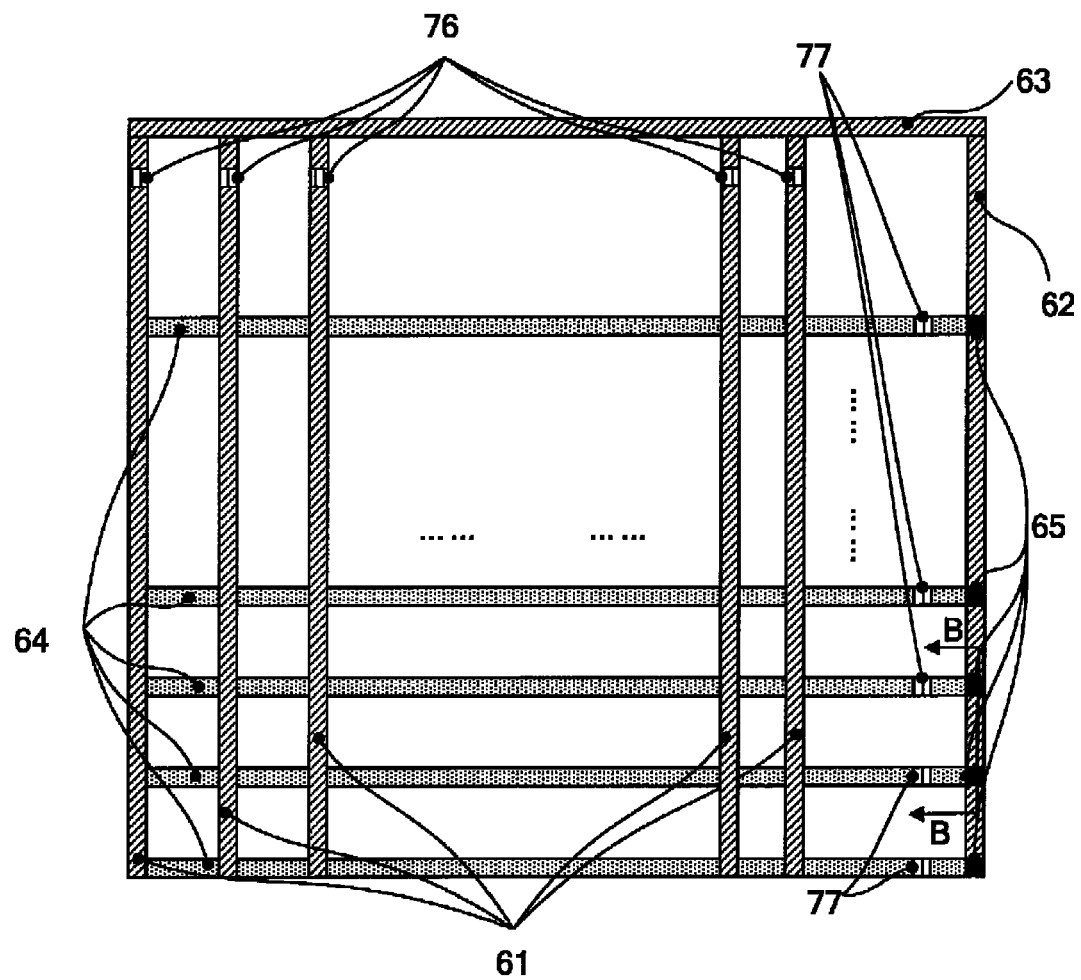

The disconnection regions of the gate scanning lines may be selected from, but not be limited to, the following two positions: the disconnection regions of the gate scanning lines are overlapped with the positions of the pre-retained photoresist parts, and the area of one disconnection region is generally larger than the area of the corresponding pre-retained photoresist parts; as shown in FIG. 9g, the disconnection region 77 of one gate scanning lines is located at the position which is shifted a predetermined distance from the position of the pre-retained photoresist part towards the gate scanning line.

The disconnection regions of the data scanning lines may be selected from, but not be limited to, the following two positions: the disconnection region of one data scanning line locates at the position where the data scanning line is electrically connected to the data-line connecting line; as shown in FIG. 9g, the disconnection region 76 of one data scanning line is located at the position which is shifted a predetermined distance from the position, where the data scanning line and data gate-line connecting line are electrically connected, towards the data scanning line.

Third Embodiment

An embodiment of the present invention provides a mother substrate 300, the main structure of the mother substrate 300 is the same as that of the mother substrate 100 of the first embodiment, and the mother substrate 300 comprises a base substrate having at least one display region thereon, and pre-cutting regions are disposed between two adjacent display regions on the substrate. After a process for forming a TFT array is completed, a cutting is performed at the pre-cutting regions to cut each display region into an independent array substrate, and each display region is finally formed into one TFT array substrate.

Figure 10:
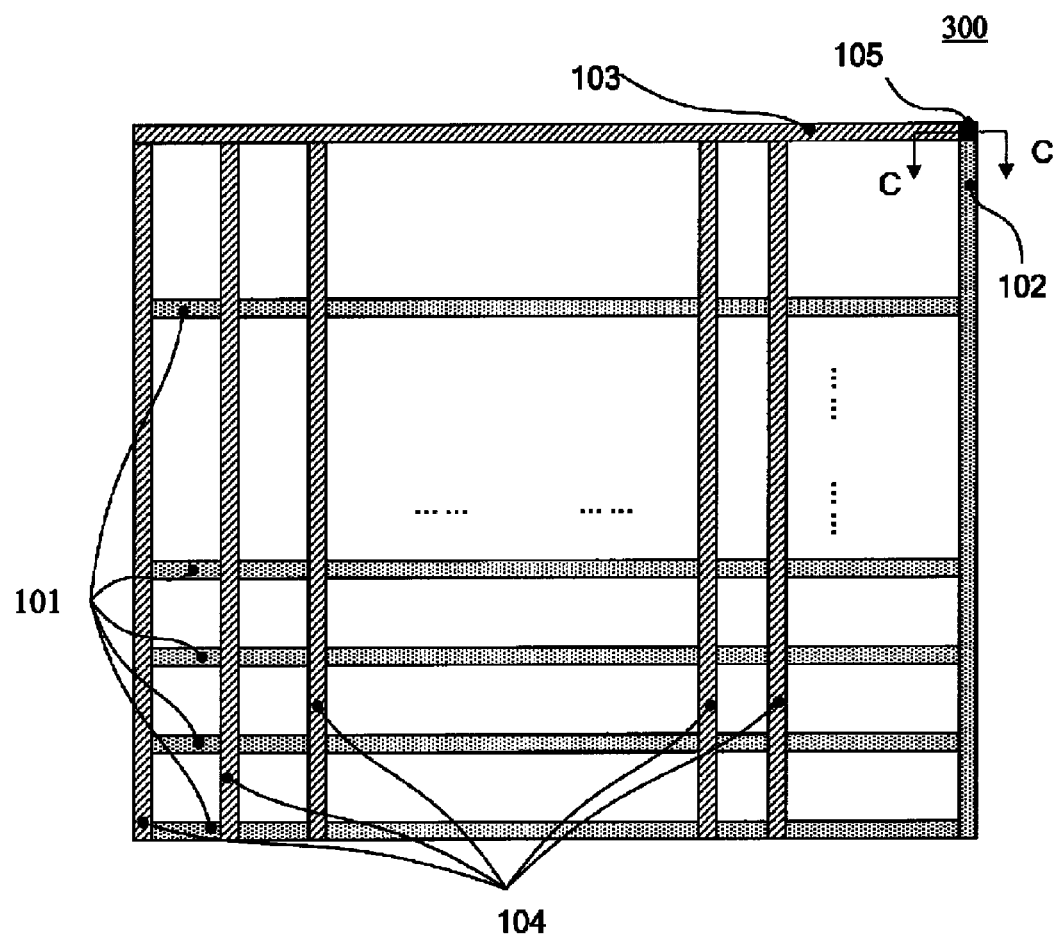
FIG. 10 is a schematic view of one display region of a mother substrate according to a third embodiment of the present invention.

In order to suppress electrostatic breakdown phenomenon occurring in the process for manufacturing the TFT array substrate, similar to that of the first embodiment, the present embodiment has two metal layers electrically connected so as to make the potentials thereof equal to each other. Next, the explanation in detail is given with regard to the electrical connection by taking one display region as an example. FIG. 10 is a schematic view of one display region and only shows the structure of a gate metal layer and a source/drain metal layer.

As shown in FIG. 10, a gate-line connecting line 102 is formed in the same layer as gate scanning lines 101 in the present embodiment, and the gate-line connecting line 102 and the gate scanning lines 101 can be manufactured in one same mask process (patterning process). Because the gate-line connecting line 102 and the gate scanning lines 101 are located in the same layer, the gate-line connecting line 102 and the gate scanning lines 101 can be in direct electric connection with each other. In this end, by only connecting the regions corresponding to the gate-line connecting line and the gate scanning lines on the mask plate to forming patterns, the direct electrical connection may be achieved.

Similarly, as shown in FIG. 10, a data-line connecting line 103 is formed in the same layer as data scanning lines 104 in the present embodiment, and the data-line connecting line 103 and the data scanning lines 104 can be manufactured in one same mask process. Because the data-line connecting line 103 and the data scanning lines 104 are located in the same layer, the data-line connecting line 103 can be in direct electric connection with the data scanning lines 104 of the corresponding display region. In this end, by only connecting the regions corresponding to the data-line connecting line and the data scanning lines on the mask plate for forming patterns, the direct electrical connection can be achieved.

Figure 11:
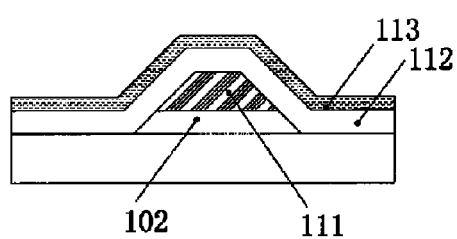
FIG. 11 is a cross-sectional view taken along C-C line after the deposition of an active thin film according to the third embodiment of the present invention.

As shown in FIG. 11, because the gate-line connecting line 102 is located in the gate metal layer and the data-line connecting line 103 is located in the source/drain metal layer, in order to connect the gate-line connecting line 102 to the data-line connecting line 103, during the process for manufacturing the gate metal layer, a photoresist part 111 is pre-retained on the gate-line connecting line 102 at the intersection 105 of the gate-line connecting line 102 and the data-line connecting line 103, and then, a gate insulating thin film 112 and an active thin film 113 are directly deposited on the substrate 67 with the pre-retrained photoresist part.

Figure 12:
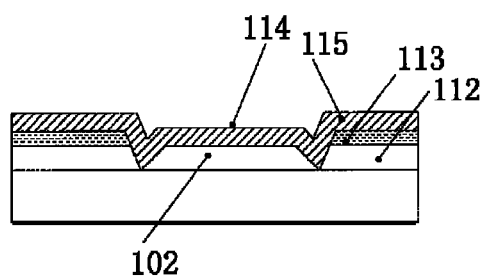
FIG. 12 is a cross-sectional view taken along C-C line after the deposition of a source/drain metal layer according to the third embodiment of the present invention.

As shown in FIG. 12, the pre-retrained photoresist part is lifted off during the process for manufacturing an active thin film pattern, such that the pre-retrained photoresist part, the corresponding gate insulating thin film 112 and the active thin film 113 on the photoresist part 111 are etched away. A through hole 114 is formed in the gate insulating thin film and at the pre-retrained photoresist part by a lifting-off process mentioned above to expose the gate-line connecting line 102, and then, a source/drain metal layer 115 is deposited on the substrate on which the through holes are formed, and a source/drain pattern is formed by etching the source/drain metal layer, as shown in FIG. 10. The source/drain pattern comprises the data scanning lines 104 intersected with the gate scanning lines 101, source/drain electrodes of thin film transistors, and the data-line connecting line 103. In order to electrically connect the gate-line connecting line 102 to the data-line connecting line 103, the data-line connecting line 103 is directly formed at a position corresponding to the through hole 114 so that the data-line connecting line 103 is electrically connected to the gate-line connecting line 102 via the through hole 114.

The embodiment of the present invention may utilize, but not be limited to, the following way for electrically connecting the gate-line connecting line to the data-line connecting line: a through hole is formed in the gate insulating thin film at the intersection of the gate-line connecting line and the data-line connecting line, and thus, the data-line connecting line can be electrically connected to the gate-line connecting line by the through hole.

No matter how to form the through hole, the data-line connecting line can be made electrically connected to the gate-line connecting line, and at this time, the gate-line connecting line is in direct electric connection with the gate scanning lines and the data-line connecting line is in direct electric connection with the data scanning lines. If charges are accumulated onto the gate metal layer or the source/drain metal layer, the accumulated charges can be dispersed to all of the gate scanning lines and the data scanning lines by the above electrical connection relationship so as to form the electrostatic balance. Under the state of the electrostatic balance, the potentials of two conductors connected to each other are identical, so there is no potential difference generated between two metal layers. Therefore, with regard to the mother substrate, the array substrate and the method for manufacturing the same provided by the embodiment of the present invention, because there is no potential difference generated between two metal layers, so electrostatic breakdown phenomenon is effectively suppressed during the process for manufacturing the TFT array substrate, and qualification ratio and yield of the products are improved.

As shown in FIG. 1, in the mother substrate provided by an embodiment of the present invention, at least one PAD region (including a gate scanning line PAD region and a data scanning line PAD region) is provided for each display region, such that the display region is connected to an exterior driving circuit by the PAD region. In order to not disadvantageously affect the forming of the current PAD region, the gate-line connecting line is formed in a pre-cutting region at the side opposite to the gate scanning line PAD region and the data-line connecting line is formed in a pre-cutting region at the side opposite to the data scanning line PAD region in a the present embodiment.

Because before cutting, the mother substrate needs to be tested to detect the characteristics of electrical connection of the mother substrate, in order not to influence the testing, before the mother substrate is tested, disconnection regions are formed at the ends, electrically connected to the gate-line connecting line, of the gate scanning lines by an etching process to disconnect the electrical connection of the gate-line connecting line and the gate scanning lines; disconnection regions are formed at the ends, electrically connected to the data-line connecting line, of the data scanning lines by an etching process to disconnect the electrical connection of the data-line connecting line and the data scanning lines. The disconnection regions are formed by etching so that the data scanning lines and the gate scanning lines are independent from each other, and thus, the signal interference is not generated, which facilitates the testing on the mother substrate in a subsequent process.

The above disconnection regions of the data scanning lines and the gate scanning lines may be selected from, but not be limited to, the two positions mentioned above.

The embodiment of the present invention also provides a method for manufacturing the TFT array substrate, as shown in FIG. 13a through FIG. 13g, and the method comprises the following steps.

Figure 13A:
FIG. 13a-13g show a first through seventh steps of a method for manufacturing the TFT array substrate according to the third embodiment of the present invention.

(1) A mother substrate for forming the TFT substrate according to the present embodiment comprises at least one display region, and a gate metal layer 108 is formed on a glass substrate 107, as shown in FIG. 13a.

Figure 13B:
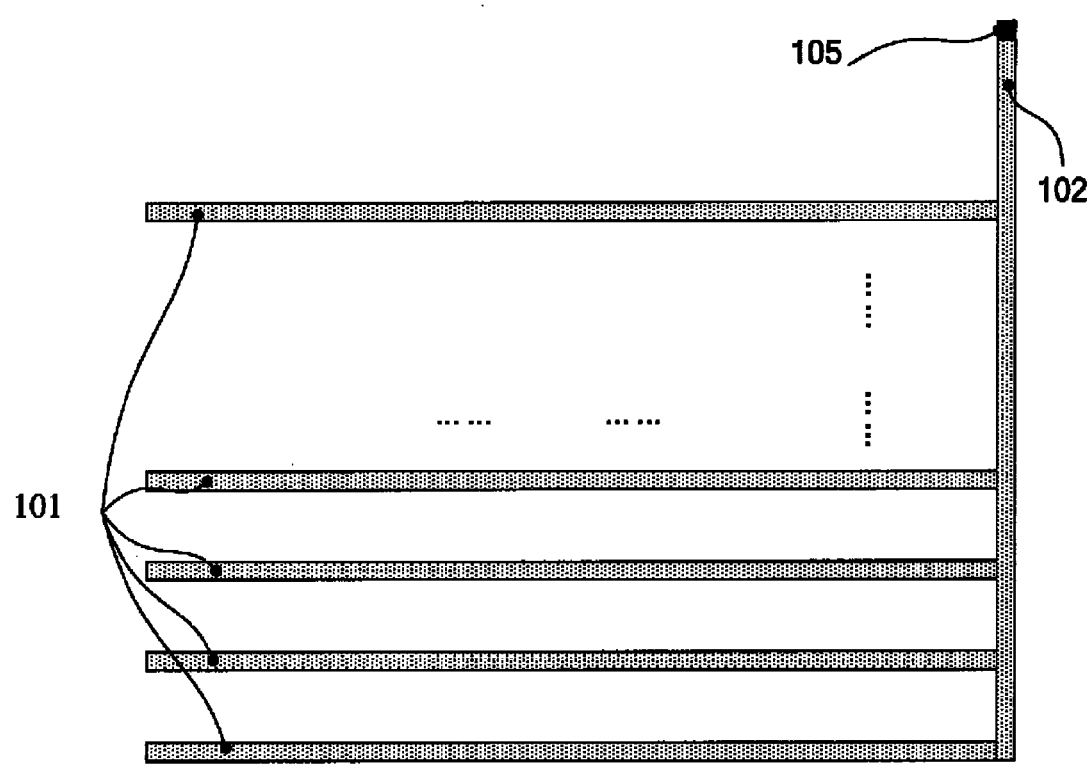
Figure 13C:
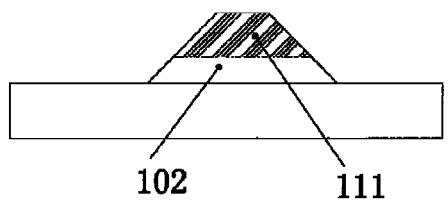

(2) The gate metal layer 108 is patterned, such that the gate metal layer 108 is formed into a gate pattern, as shown in FIG. 13b. The gate pattern comprises gate scanning lines 101, gate electrodes connected to the gate scanning lines and a gate-line connecting line 102 located at one side of each display region. Because the gate-line connecting line 102 and the gate scanning lines 101 are locates at the same layer, the gate-line connecting line 102 and the gate scanning lines 101 can be made directly connected to each other. In order to facilitate the electrical connection of the gate-line connecting line and a data-line connecting line manufactured in the sequent process, a photoresist part 111 is pre-retained on the gate-line connecting line 102 at the intersection 105 of the gate-line connecting line 102 and the data-line connecting line to be formed, and the details of the pre-retained photoresist part 111 can refer to FIG. 13c.

In operation, a method for retaining the photoresist part may include, but not be limited to, the following manner: the photoresist coated on the gate metal layer is formed into a completely-remained region, a partially-remained region and a completely-removed region by using a half-tone mask or a gray-tone mask, wherein the completely-remained region corresponds to the position of the pre-retained photoresist part, the completely-removed region corresponds to a position where the gate metal layer need to be etched away and the partially-remained region corresponds to other position of the gate pattern. After exposing and developing, the gate metal exposed in the completely-removed region is etched away, and then, the photoresist in the partially-remained region is ashed and removed. The photoresist in the completely-remained region is thinned when the photoresist in the partially-remained region is removed, but a portion of the photoresist in the completely-remained region is still retained. In order to facilitate the following lifting-off process, the area of the pre-retained photoresist part may be enlarged, or sides of the top portion of the pre-retained photoresist part is treated into a shape that is easily lifted-off, such as inverse trapezoid.

Figure 13D:
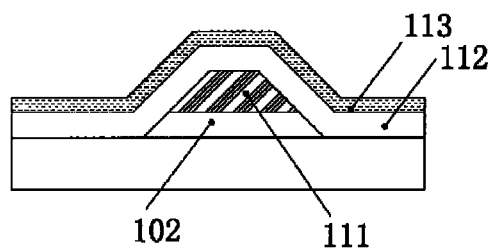

(3) As shown in FIG. 13d, a gate insulating thin film 112 and an active thin film 113 are sequentially deposited on the substrate with the gate pattern.

Figure 13E:
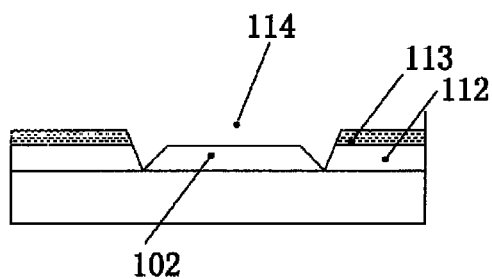

(4) The active thin film is patterned so that the active thin film 113 is formed into an active thin film pattern overlapping with the gate and lifting-off the pre-retained photoresist part to remove the pre-retained photoresist part, the gate insulating thin film 112 and the active thin film 113 corresponding to the pre-retained photoresist part so as to form a through hole 114 and expose the gate-line connecting line 102 at the pre-retained photoresist part, and FIG. 13e shows a cross-sectional view of the substrate taken at the pre-retained photoresist part after the lifting-off process.

Figure 13F:
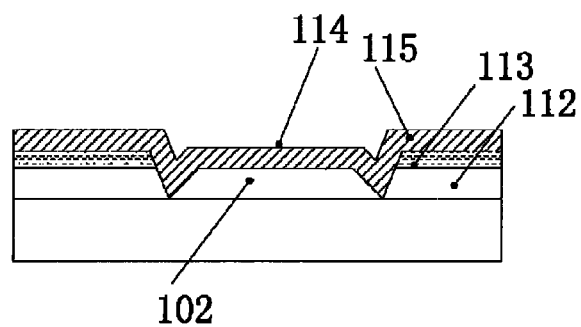

(5) A source/drain metal layer 115 is deposited on the substrate 107 with the active thin film pattern and patterning the source/drain metal layer 115 so that the source/drain metal layer 115 is formed into a source/drain pattern, and as shown in FIG. 10 and FIG. 13f. The source/drain pattern comprises data scanning lines 104 intersected with the gate scanning lines 101, source/drain electrodes of thin film transistors, and a data-line connecting line 103 at one side adjacent to the gate-line connecting line of each display region. The data-line connecting line 103 and the data scanning lines 104 are located at the same layer, so may be in direct electric connection with each other. In addition, because the gate-line connecting line 102 is exposed at the pre-retained photoresist, by only forming the data-line connecting line 103 at the positions 105 of the pre-retained photoresist, the data-line connecting line 103 can be electrically connected to the gate-line connecting line 102 via through hole.

With regard to the TFT array substrate manufactured by using the above method, during the manufacturing process, the gate-line connecting line and the gate scanning lines can be in direct electric connection with each other and the data-line connecting line and the data scanning lines can be in direct electric connection with each other, wherein the gate-line connecting line can be electrically connected to the data-line connecting line via the through hole. Therefore, with regard to the mother substrate, the TFT array substrate and the method for manufacturing the same, because there is no potential difference generated between two metal layers, electrostatic breakdown phenomenon is effectively suppressed during the process for manufacturing the TFT array substrate, and qualification ratio and yield of the products are improved.

Because before cutting, the mother substrate needs to be tested to detect the characteristics of electrical connection of the mother substrate, in order to avoid disadvantageously affecting the testing, the present embodiment further comprises the following steps before the mother substrate is tested.

(6) A patterning process is performed after deposing a passivation layer to form through holes at ends, electrically connected to the gate-line connecting line, of the gate scanning lines by using an etching process so as to expose the gate scanning lines and to form through holes at ends, electrically connected to the data-line connecting line, of the data scanning lines by using an etching process so as to expose the data scanning lines.

(7) Portions of the data scanning lines and the gate scanning lines exposed through the through holes are removed by using an etching process to form disconnection regions 117 and 118 of the data scanning lines and the gate scanning lines, respectively. The disconnection regions 117 and 118 are shown in FIG. 13g.

Figure 13G:
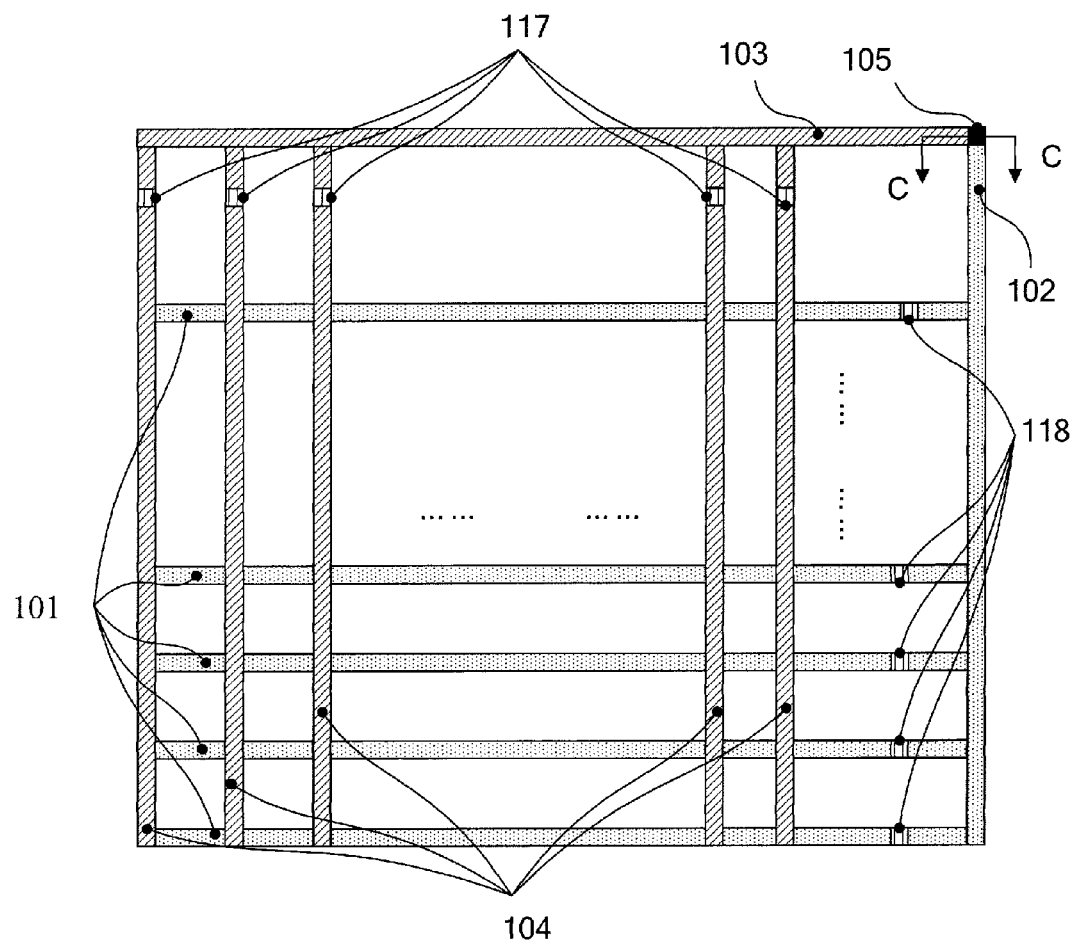

The disconnection regions of the gate scanning lines may be selected from, but not be limited to, the following two positions: the disconnection region of one gate scanning line locates at the position where the gate scanning line is electrically connected to the gate-line connecting line; as shown in FIG. 13g, the disconnection region 118 of one gate scanning line locates at the position which is shifted a predetermined distance from the position, where the gate scanning line and the gate-line connecting line are electrically connected, towards the gate scanning line.

The disconnection regions of the data scanning lines may be selected from, but not be limited to, the following two positions: the disconnection region of one data scanning line locates at the position where the data scanning line is electrically connected to the data-line connecting line; as shown in FIG. 13g, the disconnection region 117 of one data scanning line locates at the position which is shifted a predetermined distance from the position, where the data scanning line and the data-line connecting line are electrically connected, towards the data scanning line.

In the third embodiment of the present invention, the lifting-off is performed only at one position of intersection of the gate-line connecting line and the data-line connecting line, and thus, as compared with the first embodiment and the second embodiment, the number of the position where the lifting-off is performed is reduced in the third embodiment.

In the above embodiments, the case in which the gate metal layer is located below the source/drain metal layer is taken as an example for description, but in practice, the gate metal layer may be formed above the source/drain metal layer. The present invention should not be constructed as limited to the embodiments set forth herein, and all variations not regarded as a departure from the spirit and scope of the invention are intended to be included within the scope of the following claims, as long as the gate-line connecting line and the data-line connecting line are manufactured at two adjacent sides of each display region and the gate metal layer and the source/drain metal layer are electrical connected to each other by the gate-line connecting line and the data-line connecting line. In addition, the gate-line connecting line and the data-line connecting line may be simultaneously formed in the gate metal layer, or may be simultaneously formed in the source/drain metal layer, or may be respectively formed in the gate metal layer and the source/drain metal layer.

Embodiments of the present invention mainly relates to the manufacturing process of a liquid crystal panel, more particularly, to the manufacturing process of a TFT array substrate of a liquid crystal panel.

The above description only describes detailed embodiments of the present invention, and it is not a limitation of the protection scope of the present invention. Accordingly, it should be understood that many modifications or alternation which can be made easily by those of ordinary skill in the art within the disclosure of the present invention, will fall within the scope of the present invention as defined by the appended claims.

What is claimed is:

1. A method for manufacturing a mother substrate for an array substrate, the mother substrate comprising at least one display region and pre-cutting regions in a periphery of the display region, the method comprising:
   forming gate scanning lines and data scanning lines in the display region and forming a gate-line connecting line and a data-line connecting line electrically connected to each other in the pre-cutting regions,
   wherein the gate-line connecting line is electrically connected to all of the gate scanning lines in the display region, and the data-line connecting line is electrically connected to all of the data scanning lines in the display region.

2. The method as claimed in claim 1, wherein forming the gate scanning lines and the data scanning lines in the display region and the forming the gate-line connecting line and the data-line connecting line electrically connected to each other in the pre-cutting region comprises:
   (1) depositing a gate metal layer on a substrate with the at least one display region;
   (2) patterning the gate metal layer to form a gate pattern comprising the gate scanning lines, gate electrodes connected to the gate scanning lines, and the gate-line connecting line and the data-line connecting line located at two adjacent sides of each display region, and retaining photoresist parts on the data-line connecting line at intersections of the data-line connecting line and the data scanning lines to be formed, wherein the gate-line connecting line is in direct electric connection with both the data-line connecting line and the gate scanning lines;
   (3) sequentially depositing a gate insulating thin film and an active thin film on the substrate with the gate pattern;
   (4) patterning the active thin film to form an active thin film pattern overlapping with the gate electrodes, lifting-off the pre-retained photoresist parts and removing the gate insulating thin film and the active thin film corresponding to the pre-retained photoresist parts; and
   (5) forming the data scanning lines intersected with the gate scanning lines and source/drain electrodes of thin film transistors on the substrate with the active thin film pattern, wherein the data scanning lines extend to the positions of the pre-retained photoresist parts and are electrically connected to the data-line connecting line.

3. The method as claimed in claim 1, wherein forming the gate scanning lines and the data scanning lines in the display region and the forming the gate-line connecting line and the data-line connecting line electrically connected to each other in the pre-cutting region comprises:
   (1) depositing a gate metal layer on a substrate with the at least one display region;

(2) patterning the gate metal layer to form a gate pattern comprising the gate scanning lines and gate electrodes connected with the gate scanning lines, and retaining photoresist parts on the gate scanning lines at intersections of the gate-line connecting line to be formed and the gate scanning lines;

(3) sequentially depositing a gate insulating thin film and an active thin film on the substrate with the gate pattern;

(4) patterning the active thin film to form an active thin film pattern overlapping with the gate, lifting-off the pre-retained photoresist parts and removing the gate insulating thin film and the active thin film corresponding to the pre-retained photoresist parts; and (5) forming the data scanning lines intersected with the gate scanning lines, source/drain electrodes of thin film transistors, and the gate-line connecting line and the data-line connecting line located at two adjacent sides of each display region on the substrate with the active thin film pattern, wherein the gate-line connecting line is electrically connected to the gate scanning lines at positions of the pre-retained photoresist parts, and the data-line connecting line is in direct electric connection with both the gate-line connecting line and the data scanning lines.

4. The method as claimed in claim 1, wherein forming the gate scanning lines and the data scanning lines in the display region and the forming the gate-line connecting line and the data-line connecting line electrically connected to each other in the pre-cutting region comprises:

(1) depositing a gate metal layer on a substrate with the at least one display region;

(2) patterning the gate metal layer to form a gate pattern comprising the gate scanning lines, gate electrodes connected with the gate scanning lines, and the gate-line connecting line located at one side of each display region, and retaining a photoresist part on the gate-line connecting line at intersection of the gate-line connecting line and the data-line connecting line to be formed, and the gate-line connecting line is in direct electric connection with the gate scanning lines;

(3) sequentially depositing a gate insulating thin film and an active thin film on the substrate with the gate pattern;

(4) patterning the active thin film to form an active thin film pattern overlapping with the gate, lifting-off the pre-retained photoresist part and removing the gate insulating thin film and the active thin film corresponding to the pre-retained photoresist part; and (5) forming the data scanning lines intersected with the gate scanning lines, source/drain electrodes of thin film transistors, and the data-line connecting line located at one side adjacent to the gate-line connecting line of each display region on the substrate with the active thin film pattern, wherein the data-line connecting line extends to the position of the pre-retained photoresist part and is electrically connected to the gate-line connecting line, and the data-line connecting line is in direct electric connection with the data scanning lines.

5. The method as claimed in claim 1, further comprising:
depositing a passivation layer, and performing a patterning process to form through holes at ends, electrically connected to the gate-line connecting line, of the gate scanning lines so as to expose the gate scanning lines and to form through holes at ends, electrically connected to the data-line connecting line, of the data scanning lines so as to expose the data scanning lines; and removing portions of the data scanning lines and the gate scanning lines exposed through the through holes by using an etching process to form disconnection regions.

6. The method as claimed in claim 5, wherein the disconnection region of one data scanning line is located at a position where the data scanning line is electrically connected to the data-line connecting line, or at a position which is shifted a predetermined distance from the position, where the data scanning line and the data-line connecting line are electrically connected, towards the data scanning line, and the disconnection region of one gate scanning line is located at a position where the gate scanning line is electrically connected to the gate-line connecting line, or at a position which is shifted a predetermined distance from the position, where the gate scanning line and the gate-line connecting line are electrically connected, towards the gate scanning line.

\* \* \* \* \*